United States Patent
Shacham et al.

[11] Patent Number: 5,240,497
[45] Date of Patent: Aug. 31, 1993

[54] ALKALINE FREE ELECTROLESS DEPOSITION

[75] Inventors: Yosef Y. Shacham; Roman Bielski, both of Ithaca, N.Y.

[73] Assignee: Cornell Research Foundation, Inc., Ithaca, N.Y.

[21] Appl. No.: 773,188

[22] Filed: Oct. 8, 1991

[51] Int. Cl.⁵ .............................. C23C 18/40
[52] U.S. Cl. ..................... 106/1.26; 106/1.27
[58] Field of Search ................ 106/1.26, 1.27

[56] References Cited

U.S. PATENT DOCUMENTS

| | | | |
|---|---|---|---|
| 3,075,855 | 1/1963 | Agens | 117/47 |
| 3,736,170 | 5/1973 | Lu et al. | 427/304 |
| 4,655,833 | 4/1987 | Amelio et al. | 106/1.23 |
| 4,908,242 | 3/1990 | Hughes et al. | 427/443.1 |
| 5,019,425 | 5/1991 | Ro er et al. | 427/305 |

*Primary Examiner*—Mark L. Bell
*Assistant Examiner*—Margaret Einsmann

[57] ABSTRACT

Alkali-free layers of pure metals such as copper, nickel and cobalt were deposited on noble metal or noble metal sensitized substrates by electroless deposition using pure quaternary ammonium hydroxides or quaternary phosphonium hydroxides to generate the hydroxyl ion (OH$^-$) needed to produce electrons for the metal reduction.

Using the new alkaline-free electroless compositions, uniform, continuous and reproducible metal layers were selectively deposited with excellent electrical properties. With the improved compositions and process, nanosize copper lines having widths in the range of 100 to 500 nm were prepared.

8 Claims, 5 Drawing Sheets

ALKALINE FREE ELECTROLESS DEPOSITION

The present invention relates to an electroless composition and process for depositing alkali-free layers of metals such as copper, nickel, and cobalt on noble metal or noble metal sensitized substrates.

BACKGROUND OF THE INVENTION

Conventional electroless deposition of metals such as copper on a substrate use inorganic alkali metal hydroxides to basify the reaction and provide high hydroxyl ion concentrations needed for the reduction of the metal ions. Electrical components prepared from such components suffer from the disadvantages resulting from residual alkali metal in the deposited metal layer.

The present invention eliminates the alkali metal contamination by formulating the electroless compositions in an alkali-free environment to prevent alkali metal penetration into the silicon dioxide and microelectronic components.

The terms "free of alkali metal" and "substantially free of alkali metal", used interchangeably herein, mean that the ingredients used to formulate the electroless deposition composition either do not contain alkali metal elements or compounds or are present therein in trace amounts (less than 1 ppm).

SUMMARY OF THE INVENTION

The present invention relates to an electroless deposition composition, substantially free of alkali metal and suitable for depositing an alkali-metal-free metal layer on a substrate such as a noble metal or noble metal sensitized substrate, which comprises:

a source of metal ions selected from the group consisting of copper, nickel, silver and cobalt, to be reduced and deposited on the noble metal substrate;

a quaternary ammonium hydroxide or alkoxide capable of dissociating into a quaternary ammonium cation and a hydroxyl or alkoxyl ion; a reducing agent such as formaldehyde or formaldehyde precursor, present in an amount sufficient to react with said hydroxyl or alkoxyl ion to generate an electron to reduce the metal ions and deposit metal layers of copper, nickel or cobalt on the said noble metal.

Another aspect of the invention relates to the above described composition where a quaternary phosphonium compound is used in place of the quaternary ammonium hydroxide or alkoxide.

Another aspect of the present invention relates to an alkali-metal-free electroless deposition composition suitable for depositing copper metal on a noble metal or noble metal sensitized substrate which comprises:

a quaternary ammonium hydroxide capable of dissociation to produce an hydroxyl ion for reaction with an oxidant to release an electron to reduce ionized copper cation in said composition to copper metal.

A further aspect of the present invention relates to a process for the selective deposition of a first metal, such as for example, copper, cobalt, silver and nickel, on a second metal substrate, preferably a noble metal or noble metal sensitized substrate, which comprises:

a. providing an alkali-free electroless composition comprising an ionized solution of a salt of said first metal; a quaternary ammonium hydroxide capable of dissociating into a hydroxyl ion; and reducing agent for reaction with said hydroxyl ion to form an electron for reduction of the first metal ion;

b. introducing the substrate into the electroless composition maintained at a temperature sufficient to deposit said first metal on said substrate.

A yet further aspect of the present invention relates to electroless compositions and processes for preparing microelectronic components having deposited therein narrow copper lines in well defined patterns and widths as low as 100 to 500 nm.

DETAILED DESCRIPTION OF THE INVENTION

Figure 1:
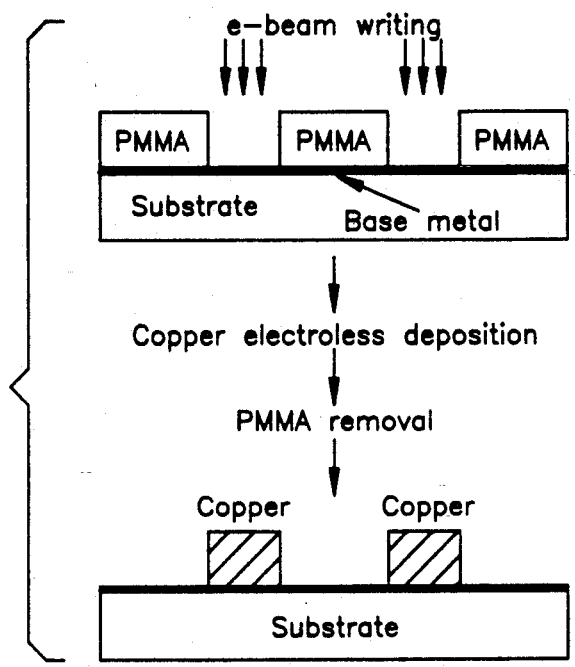
FIG. 1 shows a process flow diagram of the non-planar technique for nanoline copper deposition on a thin metal base film such as Au/Ti; Pd/Ti; Au/Cr; or Pd/Cr.

The present invention relates to improved electroless depositions formulated without the conventional alkali metal hydroxides. Under the improved composition and process, metal plating ions are supplied by dissociation of the metal salts, as for example:

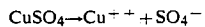

The required basicity is achieved by substituting a quaternary onium hydroxide or alkoxide in place of the alkali metal hydroxide conventionally used in electroless electroplating processes. Useful quaternary onium compounds are represented by the formula:

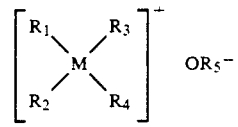

wherein M represents nitrogen or phosphorous, and $R_1$, $R_2$, $R_3$, $R_4$ are independently $C_1$-$C_{20}$ alkyl or cycloalkyl radicals, or $C_6$-$C_{20}$ aryl radicals, aralkyl radicals, and alkaryl radicals; $R_5$ is H or one of $R_1$, $R_2$, $R_3$, and $R_4$.

In the case of quaternary hydroxides, they dissociate to hydroxyl ions which produces an electron by reaction with a reducing agent such as formaldehyde:

$$2OH^- + CHOH \rightarrow HCOO^- + \tfrac{1}{2}H_2 + e^-$$

$$Cu^{++} + 2e^- \rightarrow Cu^o$$

Other onium compounds such as quaternary alkoxides can be used instead of the quaternary hydroxides:

$$R_1R_2R_3R_4MOR_5 \rightarrow R_1R_2R_3R_4M^+ + R_5O^-$$

in which case $R_5$ can be any of the radicals $R_1$, $R_2$, $R_3$ and $R_4$. $R_5$ is preferably a lower alkyl radical to provide water solubility. The preferred quaternary hydroxides and alkoxides will be water soluble or can be solubilized with an appropriate solvent or solvent mixture. The deposition is selective because the deposition occurs only on metals and not on an insulator unless the insulator is treated to accept such metal deposit. The other components of the electroless composition enhance the properties of the deposited copper or other metal layer. In order to have a sodium-free or alkali-free electroless deposition the present invention utilizes hydroxides of elements other than the alkali metals. Quaternary hydroxides are preferred for this purpose. Such hydroxides include onium hydroxides and more specifically phosphonium and ammonium hydroxides, with the latter being most preferred. Examples of useful phosphonium hydroxides include tetramethylphosphonium hydroxide, tetraethylphosphonium hydroxide and the like. Examples of useful ammonium hydroxides include tetramethylammonium hydroxide, tetraethylammonium hydroxide, tetrabulylammonium hydroxide, N-benzyltrimethylammonium hydroxide and N-benzyltriethylammonium hydroxide.

The metals to be deposited on a substrate or base metal include a variety of metals such as for example copper, nickel, cobalt, and silver.

Electroless deposition of metals such as copper, nickel, and cobalt can take place on a wide variety of substrate, including various plastic substrate. Example of suitable substrates include the noble metals such as for example palladium, gold, and platinum and mixtures thereof. The substrate can be single metals, alloys and even plastics when such surfaces are sensitized for electroless deposition. By sensitized noble metal substrate is meant a base or substrate that has been modified to incorporate particles of the noble metal, metal atoms in clusters, layers or monolayers. Methods of incorporating the noble metal are known to the art and include for example coatings, evaporation, sputtering, ion implantation and solution immersion technique. Palladium sensitization can be advantageously effected by immersion in a $PdCl_2/HCl$ solution. Properly sensitized plastics include for example polyimides, polyamides, polyacrylates, polymethacrylates (PMMA), polyolefins, polyalkanes, polystyrene and generally polymers that are not sensitive to high pH. Polymethacrylates (PMMA) polymers are preferred. Other known methods of substrate sensitization can be used. The implantation of noble metal ions close to the substrate surface followed by an etch process that reveals the noble atoms peak concentration to be at the surface.

Formaldehyde or formaldehyde precursors are preferred reducing agents. Other known reducing agents can be used for reaction with hydroxyl or alkoxyl ions to generate the electron for the reduction of metal ion to metal. These include, for example, hydrazine, ammonium hypophosphite and borohydrides free of alkali metal.

Although not specifically mentioned herein it is contemplated that Applicants' electroless composition and process may additionally include other additives known to the art as long as they don't introduce alkali metal ions or interfere with the properties of the deposited metal. Some additives are useful generally while others are indicated for specific end product uses and specific properties Such additives include complexing agents, surfactants or wetting agents to control surface tension, stabilizers for stabilizing the plating solution, ductility promoters and/or additives to retard hydrogen inclusion in the deposit, plating rate acceleration (depolarizers) and the like. Specific examples of various additives are set forth in the U.S. Pat. No. 4,908,242.

The improved electroless compositions and process are particularly useful in patterning narrow metal lines for nanoelectronics. By selective copper electroless deposition of the present invention copper lines having widths as low as 100 nm were fabricated. In one application electron beam lithography was used to pattern positive tone resist and the pattern was transferred to an isolating substrate by reactive ion etching. The resultant trench was coated by a thin layer of a barrier metal followed by a plating base metal, like gold and palladium. The base metal can be deposited, for example, by E-beam evaporation, sputtering, or by palladium chloride/HCl solution. A lift-off process was then used to remove the photoresist and due to the high selectivity of the present electroless deposition process, copper was deposited on the metal base only.

In another application the positive tone E-beam resist is patterned over a flat metal base. The copper grows inside the resist opening on the exposed base metal only. On removal of the photoresist, a well defined copper pattern is obtained. Copper lines having widths in the range of 100–500 nm were analyzed by SEM analysis.

The following examples are meant to generally describe the improved electroless composition, the process for depositing metals on a substrate using the improved composition and the electronic components where metals are selectively deposited in widths at least as low as 100–500 nm; the examples should not be construed as limiting the invention. One skilled in the art will recognize the various uses and electronic devices where such selective metal deposition is advantageous.

EXAMPLE 1

An electroless deposition solution was prepared as follows: 100 cc of deionized water was heated to 90° C. and 0.75 gram $CuSO_4.5H_2O$ (99.999%) was added followed by 2.5 grams ethylene-diamine tetraacetic acid (EDTA 99.995%). Tetramethylammonium hydroxide, (TMAH, 20% in methanol) was added to adjust the pH to 13. Tetramethylammonium cyanide (2.5 mg) was added followed by 2.0 cc of $H_2CO$ (formaldehyde) as a 37 percent solution in water. Further TMAH was added to increase the pH to 13 again.

EXAMPLE 2

Electroless deposition of copper was performed using the electroless copper solution of Example 1 and different substrate as shown in Table 1. The deposition substrate was prepared by evaporating thin gold or palladium on a substrate. Single crystal silicon wafers, with crystal orientation of <100> were used as substrate. The metals were evaporated by ion beam-induced heating in a vacuum system. The gold or palladium were deposited on a thin titanium or chromium layers that served as an adhesion layer between the substrate and the noble metals.

The substrate was immersed in the deposition solution at the temperature in the range of 45° C.-65° C. Immersion time varied between 1 minute to 60 minutes. The active surface was facing down to reduce precipitation. At the end, the samples were washed thoroughly in distilled ionized water and then dried in nitrogen. Typical deposition rates used were 0.02 to about 0.05 μm/minute, depending on the temperature. Good copper layers, with shiny appearance, uniform over, the samples, with small grain size (below 200 Å), were formed on gold and palladium substrate. Thickness was measured as a function of time using profilometry (Tencor-Alpha-step) and Rutherford back scattering. The electrical conductivity of the electroless copper layer was measured by the four-point-probe technique. The copper specific resistivity is $2.1 \pm 0.1$ per cm.

TABLE 1

| Substrate | T °C. | pH | Time (Min) | Thickness |
|---|---|---|---|---|
| Pd | 50°-60° C. | 11.5-11.8 | 10 | 800-1400Å |
| Cu | 50°-60° C. | 11.5-11.8 | 10 | 1800-2200Å |
| Au | 50°-60° C. | 11.5-11.8 | 10 | 2600-3200Å |

Figure 7:
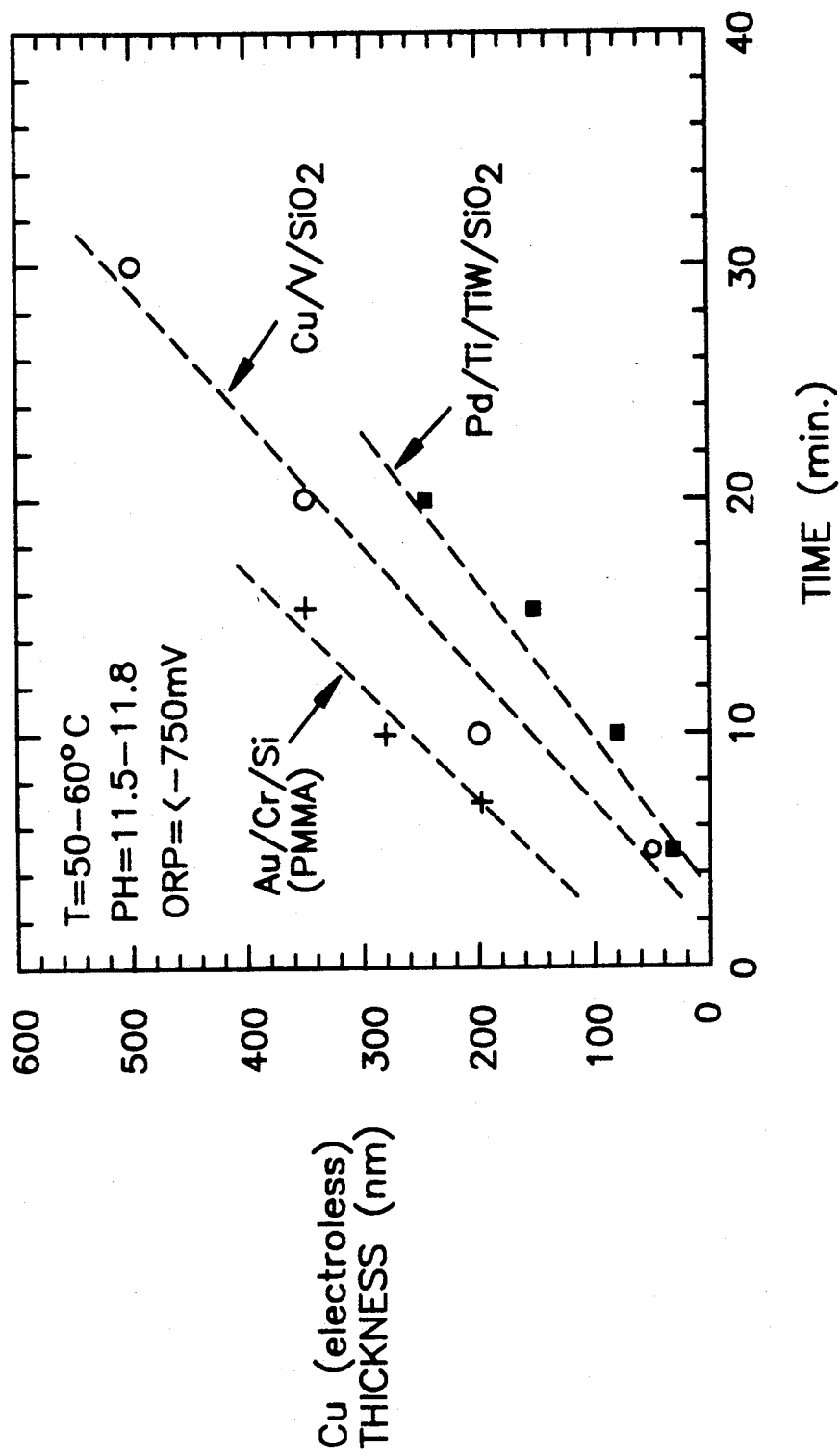
FIG. 7 shows a plot of the thickness of copper deposition versus time in minutes deposited by electroless deposition on Au/Cr/Si; Cu/V/$SiO_2$; and Pd/Ti/TiW/$SiO_2$ substrate bases.

FIG. 7 shows a plot of the thickness of copper deposition (nm) versus time (minutes) for various substrate plated at a rate of $200 \pm 30$ Å/minute, a temperature of 50°-60° C., a pH of 11.5 to 11.8 and a redox potential referred to Pt electrode equal or less than $-750$ mV. Note that Pt is also coated with electroless copper. The system Au/Cr/Si (PMMA) (+++line) was deposited at 214 Å/minute. The system Cu/V/SiO$_2$(OOO line) was deposited at 18 Å/minute. The system Pd/Ti/-TiW/SiO$_2$ (■ line) was deposited at 171 Å/minute.

Figure 8:
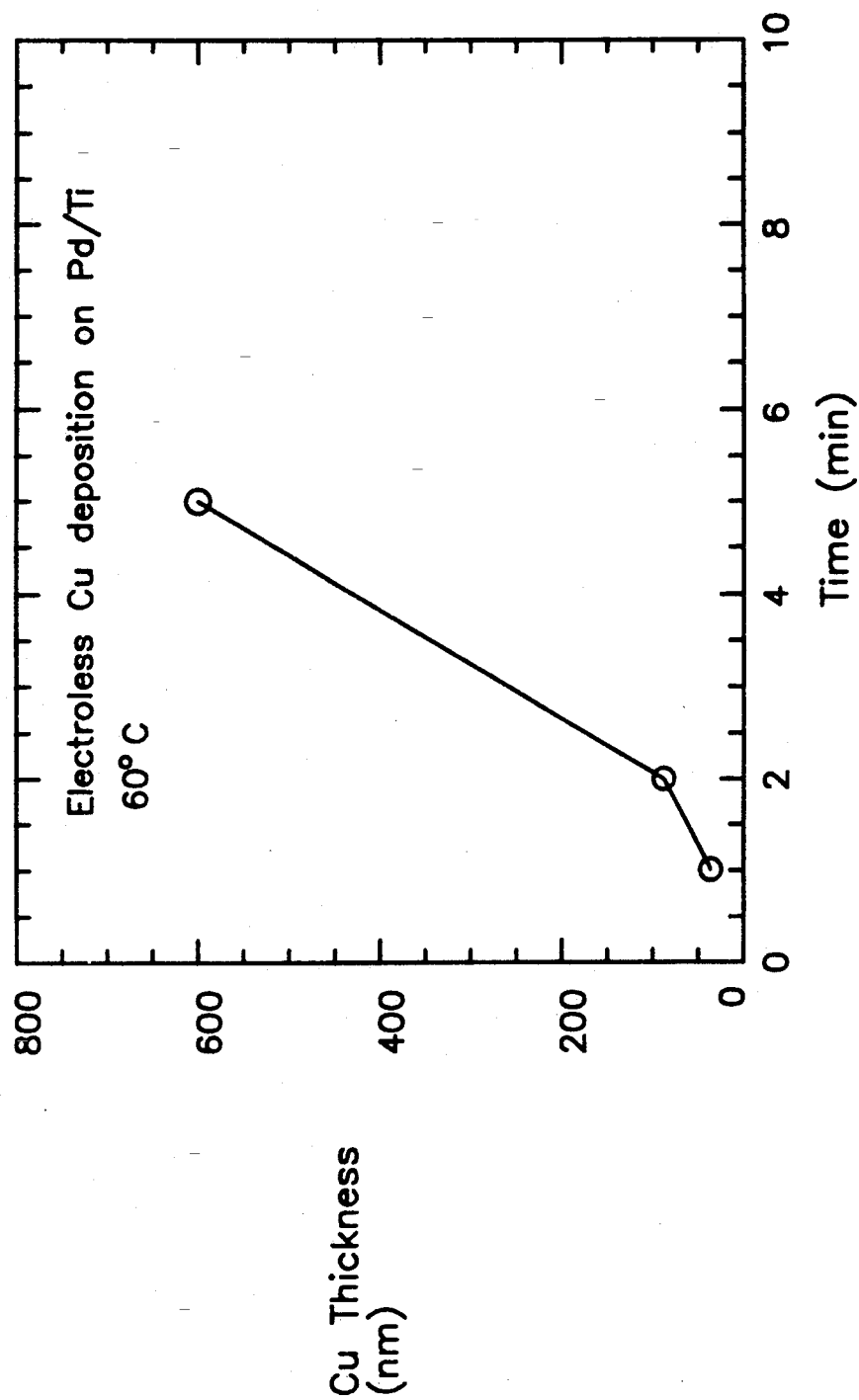
FIG. 8 is a Rutherford Back Scattering (RBS) plot of electroless copper thickness (nm) versus time in minutes when deposited on a palladium on titanium base (Pd/Ti).

FIG. 8 is a plot of electroless copper thickness (nm) versus time (minutes) and shows Rutherford Back Scattering (RBS) of electroless copper layer deposited on palladium on titanium base (Pd/Ti).

EXAMPLE 3

Preparation of alkaline free deposit of cobalt on a silicon substrate coated with palladium.

An electroless deposition solution was prepared as follows: 100 cc of water was heated to 90° C. and 0.845 grams of CoSO$_4$.H$_2$O (99.999%) was added followed by 5.03 grams of (NH$_4$)H$_2$PO$_2$.H$_2$O. The ammonium salt of citric acid, (0.05 grams) was added followed by 0.06 grams of (NH$_4$)$_2$SO$_4$. Next 4.0 grams of EDTA was added and the pH was adjusted to pH 13 with tetramethylammonium hydroxide.

EXAMPLE 4

An electroless deposition solution was prepared as follows: 300 cc of DI water was heated to 90° C. and 0.74 grams of CuSO$_4$.5H$_2$O was added followed by 2.5 grams of ethylenediaminetetraacetic acid (EDTA), and 10 mg of tetra-ethylammonium cyanide. Tetramethylammonium methoxide was added to adjust the pH to 13. The tetramethylammonium methoxide (TMAM) was prepared by evaporating 60 cc of tetramethylammonium hydroxide (20% in MeOH), benzene (120 cc) and methanol (100 cc) to give 20 cc TMAM of solution. The tetramethylammonium methoxide solution was added to copper sulfate solution pH of 13.37. 1 cc of HCOH (37%) in methanol was added and more TMAM was added to readjust the pH to 13.07. Electroless copper was deposited on palladium coated samples at 60°-70° C. using deposition rates of 300 Å/min at 70° C. and 50 Å/min at 60° C.

EXAMPLE 5

An electroless deposition solution was prepared as follows: 100 ml of DI water were heated to 90° C. and 0.75 grams of CuSO$_4$.5H$_2$O was added followed by 2.5 grams of ethylenediamine tetraacetic acid, 10 mg of tetraethylammonium cyanide. Tetrabutylphosphonium hydroxide was added to adjust the pH to 13. The tetrabutylphosphonium hydroxide was prepared by reacting 2.7 grams tetrabutylphosphonium bromide with 4.2 grams silver oxide (Ag$_2$O) in 20 ml of DI water. After stirring at room temperature, the solution was filtered and the product was tetrabutylphosphonium hydroxide. Prior to the deposition, 1 cc formaldehyde (37% H$_2$O in water) was added to 50 cc electroless deposition solution. Next 5 cc of surfactant RE 610 (GAF) 3% in H$_2$O was added. Electroless copper was deposited on palladium coated silicon wafers at 70° C. The growth rate was slow and only about 100 Å copper was observed after 10 minutes.

EXAMPLE 6

Nanoline Copper Deposition—Non Planar Technique

Two deposition techniques were developed as described herein. The first yields copper lines above the deposition plane and the second results in a fully planarized copper lines buried in a host insulator. The non-planar method yields nanolines with high aspect ratio and smooth vertical sidewalls. The fully planar method yield buried nanolines with an upper topography which is unique to selective deposition process. Products were analyzed by SEM.

The copper was deposited from aqueous solutions that contains the following components:

Solution 1: CuSO$_4$, NaOH, formaldehyde, CN$^-$, EDTA, and surfactants.

Solution 2: Similar to solution 1, but the NaOH is replaced by tetramethylammonium hydroxide (TMAH), 20% in Methanol.

Solution 3: METEX 9048, MacDermid Inc., Waterbury, Ct.

The solution temperature and pH were monitored continuously using the ORION SA250 pH meter with a standard ROSS combination electrodes. The meter was calibrated using a standard pH 10 solution. This system is equipped with a temperature sensor and automatic temperature compensation. The pH of solutions 1 and 2 was adjusted to be about 13 at room temperature and the pH dropped to about 12.1~12.2 at 55° C. and 11.5~11.6 at 65° C.

A thin metal base film (Au/Ti or Pd/Ti) was deposited on the substrate using the non-planar technique illustrated by the process flow diagram of FIG. 1. PMMA was spin cased on the wafer and cured at 170° C. for one hour. The patterns were exposed by electron beam lithography using the JEOL model 5DIIU system. The electron energy was 50 keV and the dose ranged from 200 to 300 μC/cm$^2$. For the very fine lines, a single-scan was used with dose ranged from 2 nC/cm to 3.2 nC/cm. The resist was developed in MIBK, rinsed in DI water and dried.

Copper was deposited on the exposed regions where the resist had been removed. Following deposition the resist was removed by acetone or methylene chloride and the samples were rinsed in methanol followed by DI water.

The etched wafer was coated with the base metal (15-25 nm of Au/Ti or Pd/Ti) by e-beam evaporation. The resist and metal were lifted-off in acetone followed by ultrasonic finishing of the lift-off process. The wafer was etched in an $O_2$ plasma to remove organic residues. Copper was deposited inside the trenches from the electroless deposition solution in the 55° C.-65° C. temperature range. The copper nanolines were analyzed by SEM.

Figures 3, 4:
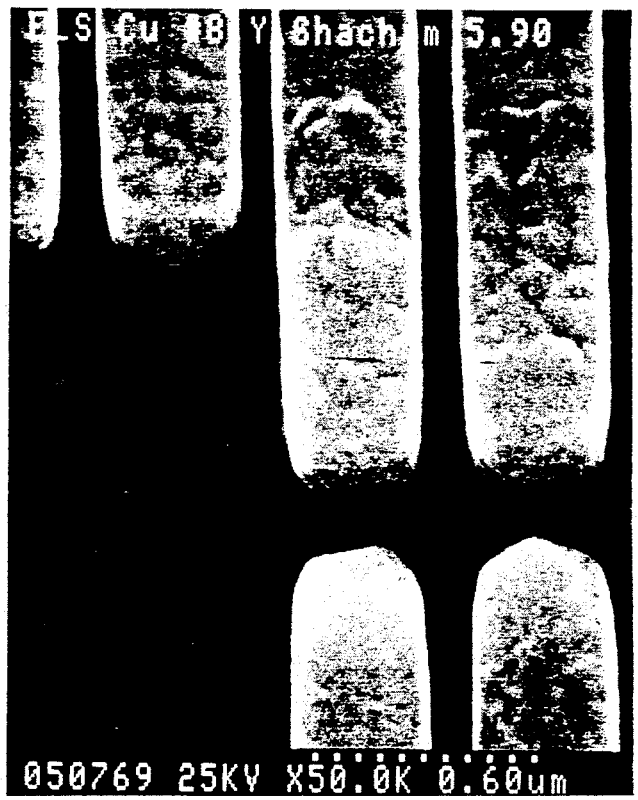
FIG. 3 shows 300 nm wide copper lines with 100 nm space made by the non-planar technique.
FIG. 4 shows a 125 nm wide and 450 nm high copper line made by the non-planar technique.

Typical copper nanolines made by the non-planar technique using solution 1 are presented in FIG. 3 and FIG. 4.

The ability of the non-planar technique to define very narrow spaces is demonstrated in FIG. 3 where 300 nm wide copper lines, separated by 100 nm spaces are shown. The non-planar technique produces also narrow lines like the one shown in FIG. 4, which is about 150 nm wide and 450±50 nm high. The nanolines upper surface topography was found to depend on the line width and the sample cleaning procedure. Surface roughness reflects the poly-crystalline nature of the copper. For example, in some of the lots, the microcrystalline size of the 100 nm lines was of the same size as the line width. The crystal size increases linearly with the line width till about 400 nm where they started to decrease with increasing line width.

EXAMPLE 7

Figure 2:
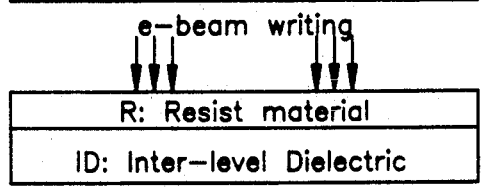
FIG. 2 shows a process flow diagram of the fully-planar technique for nanoline copper deposition.
Figure 2:
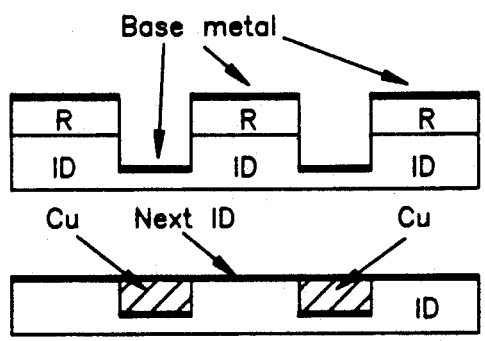

A fully planar technique for nanoline copper deposition was conducted according to the process flow diagram shown in FIG. 2.

Wafers coated with 0.3 μm $SiO_2$ were coated with PMMA. The exposure and development steps were identical to those as described in Example 6. The patterned wafers were etched in an Applied Materials reactive ion etcher with $CHF_3+O_2$ at a pressure of 30 mT and the power density of 0.25 W/cm². The plasma bias referenced to the wafer was ~ −600±20 mV. The oxide was etched at a rate of ~300 Å/min and the trench depth ranged from 0.1 μm-0.25 μm.

The etched wafer was coated with the base metal (15-25 nm of Au/Ti or Pd/Ti) by e-beam evaporation. The resist and metal were lifted-off in acetone followed by ultrasonic finishing of the lift-off process. The wafer was etched in an $O_2$ plasma to remove organic residues. Copper was deposited inside the trenches from the electroless deposition solution in the 55° C.-65° C. temperature range. The copper nanolines were analyzed by SEM.

Figure 5:
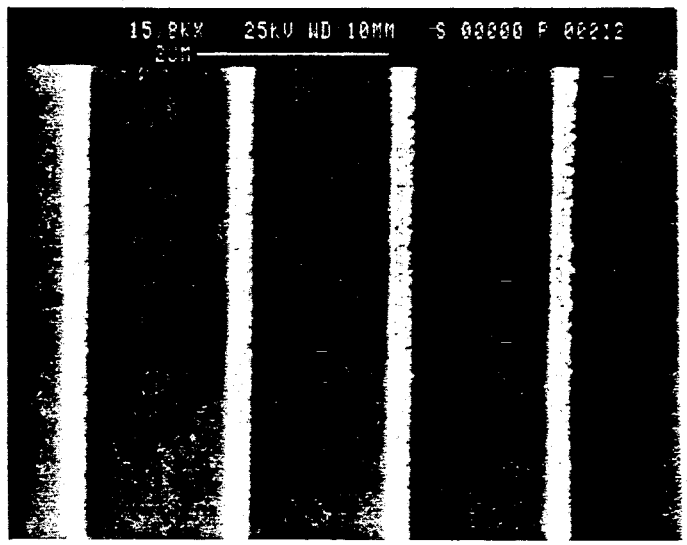
FIG. 5 shows 150 nm copper lines made by fully planarized technique.

Typically fully planarized copper nanolines, with line width of 150 nm are shown in FIG. 5.

The copper deposition solution was found to penetrate 100 nm wide and 250 nm deep in silicon dioxide. The copper was deposited and formed fully buried nanolines. The upper topography of the lines showed a vague structure in the center. A closer look indicated that there was a dip in the upper topography which separates the line into two halves.

Figure 6:
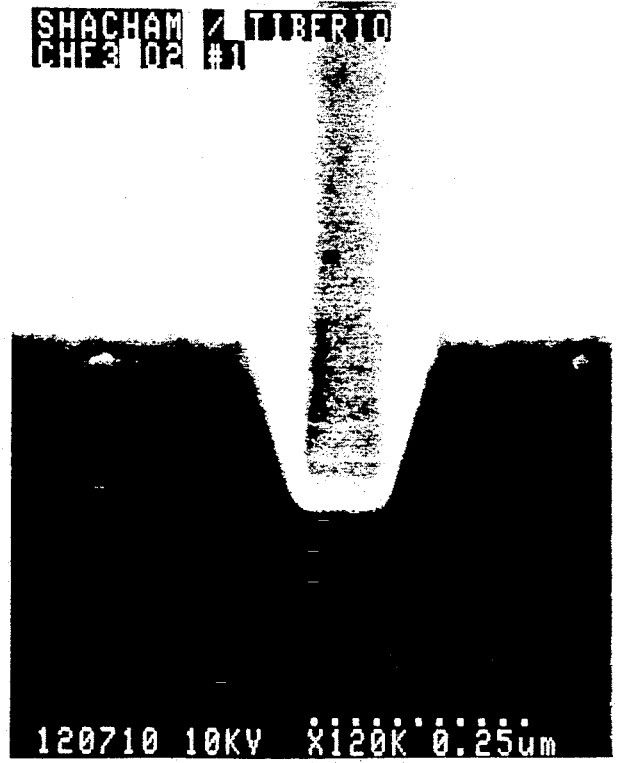
FIG. 6 is a SEM picture of a 100 nm wide trench in $SiO_2$.

FIG. 6 shows a SEM picture of copper deposited electrolessly in a 100 nm wide trench in $SiO_2$.

What is claimed is:

1. An electroless deposition composition, free of alkali metal and suitable for depositing a metal layer on a noble metal or noble metal sensitized substrate, comprising:

a) a source of metal ions; said metal selected from the group consisting of copper, cobalt, nickel and silver;
   b) a quaternary onium hydroxide or alkoxide capable of dissociating into a quaternary onium cation and hydroxyl or alkoxyl ion;
   c) a reducing agent present in an amount sufficient to react with said hydroxyl or alkoxyl ion to generate electrons to react with said metal ions to deposit a layer of metal on the noble metal substrate,
   d) a source of cyanide ions;
   said quaternary onium compound having the formula:

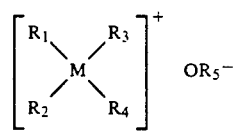

wherein M represents nitrogen or phosphorus, and $R_1$, $R_2$, $R_3$, $R_4$ are independently $C_1$-$C_{20}$ alkyl or cycloalkyl radicals, or $C_6$-$C_{20}$ aryl radicals, aralkyl radicals, and alkaryl radicals; and $R_5$ is H or one of $R_1$, $R_2$, $R_3$, and $R_4$.

2. The composition of claim 1 wherein the noble metal is selected from the group consisting of palladium, gold and platinum.

3. The composition of claim 2 wherein the deposited metal is copper and the onium compound is a quaternary ammonium hydroxide.

4. The composition of claim 2 wherein the deposited metal is copper and the onium compound is a phosphonium compound.

5. The composition of claim 1 wherein the deposited metal is copper and the source of cyanide ions is a quaternary ammonium cyanide.

6. The composition of claim 1 wherein the quaternary onium hydroxide or alkoxide is N-benzyltrimethylammonium hydroxide.

7. An electroless deposition composition, free of alkali metal and suitable for depositing a metal layer on a noble metal or noble metal sensitized substrate, comprising:

a) a source of metal ions; said metal selected from the group consisting of copper, cobalt, nickel and silver;
   b) N-benzyltrimethylammonium hydroxide;
   c) a reducing agent present in an amount sufficient to react with hydroxyl from said N-benzyltrimethylammonium hydroxide to generate electrons to react with said metal ions to deposit a layer of metal on the noble metal substrate.

8. An electroless deposition composition, free of alkali metal and suitable for depositing a metal layer on a noble metal or noble metal sensitized substrate, comprising:

a) a source of metal ions; said metal selected from the group consisting of copper, cobalt, nickel and silver;
   b) a phosphonium hydroxide or alkoxide capable of dissociating into a phosphonium cation and hydroxyl or alkoxyl ion;
   c) a reducing agent present in an amount sufficient to react with said hydroxyl or alkoxyl ion to generate electrons to react with said metal ions to deposit a layer of metal on the noble metal substrate, said phosphonium compound having the formula:
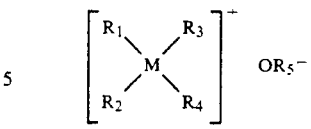
wherein M represents phosphorus, and $R_1$, $R_2$, $R_3$, $R_4$ are independently $C_1$-$C_{20}$ alkyl or cycloalkyl radicals, or $C_6$-$C_{20}$ aryl radicals, aralkyl radicals, and alkaryl radicals; and $R_5$ is H or one of $R_1$, $R_2$, $R_3$, and $R_4$.
* * * * *